US008822124B2

(12) United States Patent
Trefonas et al.

(10) Patent No.: US 8,822,124 B2
(45) Date of Patent: Sep. 2, 2014

(54) UNDERLAYER COMPOSITION AND METHOD OF IMAGING UNDERLAYER COMPOSITION

(75) Inventors: Peter Trefonas, Medway, MA (US); Phillip Dene Hustad, Manvel, TX (US); Cynthia Pierre, Midland, MI (US)

(73) Assignee: Dow Global Technologies LLC, Midland, MI (US)

(*) Notice: Subject to any disclaimer, the term of this patent is extended or adjusted under 35 U.S.C. 154(b) by 10 days.

(21) Appl. No.: 13/253,012

(22) Filed: Oct. 4, 2011

(65) Prior Publication Data

US 2012/0088188 A1  Apr. 12, 2012

Related U.S. Application Data

(60) Provisional application No. 61/389,559, filed on Oct. 4, 2010.

(51) Int. Cl.
*G03C 8/40* (2006.01)
(52) U.S. Cl.
USPC ............................ 430/203; 430/202; 977/888
(58) Field of Classification Search
None
See application file for complete search history.

(56) References Cited

U.S. PATENT DOCUMENTS

| | | | |
|---|---|---|---|
| 6,423,465 B1 | 7/2002 | Hawker et al. | |
| 7,521,094 B1 | 4/2009 | Cheng et al. | |
| 2003/0091752 A1 | 5/2003 | Nealey et al. | |
| 2005/0169957 A1 | 8/2005 | Hossainy | |
| 2006/0134556 A1 | 6/2006 | Nealey et al. | |
| 2007/0142587 A1 | 6/2007 | Baker et al. | |
| 2008/0248331 A1 | 10/2008 | Gallagher et al. | |
| 2009/0035668 A1* | 2/2009 | Breyta et al. | 430/18 |
| 2009/0179001 A1 | 7/2009 | Cheng et al. | |
| 2009/0182093 A1 | 7/2009 | Cheng et al. | |
| 2010/0167214 A1 | 7/2010 | Yoon et al. | |

FOREIGN PATENT DOCUMENTS

| | | |
|---|---|---|
| EP | 1813986 A2 | 8/2007 |
| WO | 0025178 A2 | 5/2000 |
| WO | 2010054979 A1 | 5/2010 |

OTHER PUBLICATIONS

Japanese Patent No. 2005320521; Publication Date: Nov. 17, 2005; Abstract Only, 1 page.
CN Office Action from the The State Intellectual Property Office of the People's Republic of China for Appl. No. 201110462290.8, dated Mar. 25, 2013, 6 pages.
English abstract for on CN 101308329 A published Nov. 19, 2008.

(Continued)

*Primary Examiner* — Cynthia Hamilton
(74) *Attorney, Agent, or Firm* — Cantor Colburn LLP

(57) ABSTRACT

A method of forming a pattern comprises diffusing an acid formed by irradiating a portion of a photosensitive layer, into an underlayer comprising an acid sensitive copolymer having acid decomposable groups and attachment groups covalently bonded to the surface of the substrate and/or forming an interpolymer crosslink. Diffusing comprises heating the underlayer and photosensitive layer. The acid sensitive group reacts with the diffused acid to form a polar region on the underlayer, with the shape of the pattern. The photosensitive layer is removed, forming a self-assembling layer comprising a block copolymer having a first block with an affinity for the polar region, and a second block having less affinity for the polar region. The first block forms a domain aligned to the polar region, and the second block forms another domain aligned to the first. Removing either domain exposes a portion of the underlayer.

8 Claims, 5 Drawing Sheets

(56) References Cited

OTHER PUBLICATIONS

Korean Office Action from the Korean Intellectual Property Office (KIPO) for Application No. 10-2011-0100911 on May 16, 2013, 4 pages.
English abstract for CN 1324456 A publication date Nov. 28, 2001.
E. Han et al., "Photopatternable Imaging Layers for Controlling Block Copolymer Microdomain Orientation", Advanced Materials, 19, pp. 4448-4452, 2007.
F.K. Hansen, "The Measurement of Surface Energy of Polymers by Means of Contact Angles of Liquids on Solid Surfaces—A short overview of frequently used methods", Department of Chemistry, University of Oslo, pp. 1-12, 2004.
M. Ando, "The Printable OTFT Technology for Display Applications", Hitachi Cambridge Laboratory, PEE 2009 Presentation, 33 pages.
P. Mansky et al., "Controlling Polymer-Surface Interaction with Random Copolymer Brushes", Science, 275, pp. 1458-1468, 1997.
Bang, Joon et al. "Block Copolymer Nanolithography: Translation of Molecular Level Control to Nanoscale Patterns"; Adv. Mater. 2009, 21, 4769-4792.
Black, C. T. "Polymer Self-Assembly as a Novel Extension to Optical Lithography", ACS Nano 2007, 1, 147-150.
Cheng et al. "Dense Self-Assembly on Sparse Chemical Patterns: Rectifying and Multiplying Lithographic Patterns Using Block Copolymers" Adv. Mater. 2008, 20, 3155-3158.
Cheng, J. Y., et al. "Templated Self-Assembly of Block Copolymers: Top-Down Helps Bottom-Up" Adv. Mater. 2006, 18, 2505-2521.
Eungnak Han et al. "Effect of Composition of Substrate-Modifying Random Copolymers on the Orientation of Symmetric and Asymmetric Diblock Copolymer Domains" Macromolecules 2008, 41, 9090-9097.
Hamley, I. W. "Nanostructure fabrication using block Nanotechnology copolymers" Nanotechnology 14 (2003) R39-R54.
Ji, S. et al. "Generalization of the Use of Random Copolymers to Control the Wetting Behavior of Block Copolymer Films" Macromolecules 2008, 41, 9098-9103.
Krausch, G. et al. "Nanostructured Thin Films via Self-Assembly of Block Copolymers" Adv. Mater. 2002, 14, No. 21, Nov. 4. pp. 1579-1583.
Park, Cheolmin et al., "Enabling nanotechnology with self assembled block copolymer patterns" Polymer 44 (2003) 6725-6760.
Ruiz, R. et al. "Induced Orientational Order in Symmetric Diblock Copolymer Thin Films"; Adv. Mater. 2007, 19, 587-591.
Ryu, D. Y. et al. "A Generalized Approach to the Modification of Solid Surfaces" Science (2005), 308, 236-239.
Segalman, R. A. "Patterning with block copolymer thin films" Materials Science and Engineering R 48 (2005) 191-226.
Welander, A. M. et al. "Rapid Directed Assembly of Block Copolymer Films at Elevated Temperatures" Macromolecules 2008, 41, 2759-2761.

\* cited by examiner

UNDERLAYER COMPOSITION AND METHOD OF IMAGING UNDERLAYER COMPOSITION

CROSS-REFERENCE TO RELATED APPLICATION

This application is a nonprovisional of U.S. Provisional Application No. 61/389,559, filed on Oct. 4, 2010, the content of which is incorporated by reference herein in its entirety.

BACKGROUND

Block copolymers may be used in directed self-assembly processes to form patterns without requiring a photolithographic process. The block copolymers can form the patterns by assembling on a neutral or patterned surface having neutral and polar regions. Such a neutral or patterned surface can be afforded by use of a polymer brush underlayer.

Polymer brushes are polymeric chains affixed to a surface of a substrate formed of, for example, a semiconductor material. The surface is reactively modified to the desired thickness and surface energy using polymer brush precursors with a desired composition. The composition of a random copolymer brush layer is tuned to afford the desired neutral surface. For block copolymers capable of self assembly but for which it is unfeasible to synthesize random copolymers of repeating units of each block (such as where different polymerization mechanisms would be required, or where the composition of the brush copolymer is not), end-group functionalization or incorporation of reactive-group containing monomers in the brush copolymer has been performed. (See, e.g., P. Mansky, Y. Liu, E. Huang, T. P. Russell, C. Hawker, "Controlling polymer surface interaction with random copolymer brushes", *Science,* 275, 1458, (1997)).

Such compositional modifications to the brush copolymer are designed to provide functional sites for grafting. However, there is no disclosure in the art of adjusting the brush polymer composition to change surface polarity lithographically, and hence form a patterned surface on which the self-assembling layer can form.

STATEMENT OF INVENTION

The shortcomings of the prior art are overcome and additional advantages are provided through the provision of, in an embodiment a method of forming a pattern, comprising diffusing an acid, generated in a photosensitive layer comprising a photoacid generator, by irradiating a portion of the photosensitive layer, into an adjacent portion of an underlayer comprising an acid sensitive copolymer comprising an acid decomposable group, an attachment group, and a functional group, the attachment group being covalently bonded to a hydrophilic surface of a substrate, crosslinked to form an interpolymer crosslink, or both covalently bonded to the surface of the substrate and crosslinked to form an interpolymer crosslink, wherein the photosensitive layer is disposed on a surface of the underlayer, diffusing comprises heating the underlayer and photosensitive layer, and the acid sensitive group of the acid sensitive copolymer in the underlayer reacts with the diffused acid to form a polar region at the surface of the underlayer, the polar region having a shape of the pattern; removing the photosensitive layer; forming a self-assembling layer on the surface of the underlayer, the self-assembling layer comprising a block copolymer having a first block with an affinity for the polar region, and a second block having less affinity for the polar region than the first block, wherein first block forms a first domain aligned to the polar region, and the second block forms a second domain aligned adjacent to the first domain, and removing either the first or second domain to expose an underlying portion of the underlayer.

In another embodiment, a underlayer comprises an acid sensitive copolymer of the formula:

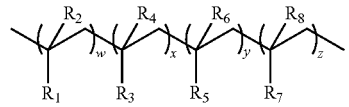

wherein $R_1$ is a $C_{1-30}$ acid decomposable group, $R_3$ is a $C_{1-30}$ attachment group comprising a hydroxy group, $R_5$ and $R_7$ are each independently a $C_{1-30}$ functional group comprising an aromatic group, $R_2$, $R_4$, $R_6$, and $R_8$ are independently H or a $C_{1-10}$ organic group, and mole fractions w and x are 0.001 to 0.999 and mole fractions y and z are 0 to 0.9, wherein the sum of mole fractions w, x, y, and z is 1, wherein the acid sensitive copolymer is covalently bonded to a hydrophilic surface of a substrate through the attachment group by an alkoxide linkage, is crosslinked to form an interpolymer crosslink, or is both covalently bonded to the hydrophilic surface of the substrate and crosslinked to form an interpolymer crosslink, and wherein the acid decomposable groups are tertiary alkyl ester groups, acetal groups, ketal groups, carbonate groups, or a combination comprising at least one of the foregoing acid decomposable groups.

In another embodiment, a self-assembled multilayer film comprises an underlayer comprising an acid sensitive copolymer comprising an acid decomposable group, an attachment group, and a functional group, the underlayer being disposed on and covalently bonded to a hydrophilic surface of a substrate, crosslinked to form an interpolymer crosslink, or both covalently bonded to the surface of the substrate and crosslinked to form an interpolymer crosslink through the attachment group, and wherein portions of a surface of the underlayer having the acid decomposable groups decomposed to form a patterned surface of the underlayer, and a self-assembling layer disposed on the patterned surface of the underlayer, the self-assembling layer comprising a block copolymer having a first block with an affinity for the portion of the surface of the underlayer having decomposed acid decomposable groups, and a second block having less affinity for the portion of the surface of the underlayer having decomposed acid decomposable groups than the first block, wherein the first block forms a first domain aligned to the portion of the underlayer having the decomposed acid decomposable groups, and the second block forms a second domain on the surface of the underlayer aligned with and adjacent to the first domain.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1A:
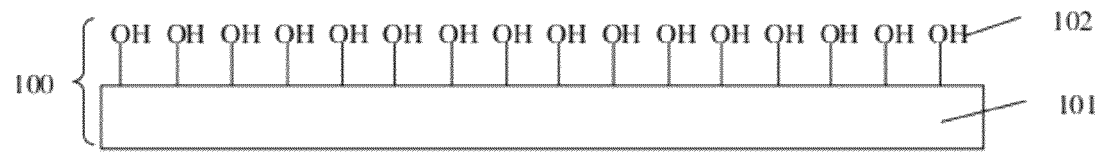
FIGS. 1A-1J shows an exemplary method of forming a pattern on an underlayer in one embodiment in which acid is diffused from an overlying photosensitive layer into a underlayer.

Disclosed herein is a novel copolymer underlayer, sometimes referred to herein simply as an underlayer, for directed self-assembly of a block copolymer. The underlayer comprises a random copolymer containing acid decomposable group, an attachment group, and a functional group. The proportion of these monomers is adjustable to moderate surface energies to match those of a self-assembling block copolymer which is formed on the surface of the underlayer. The underlayer copolymer is bonded to a hydrophilic surface of a substrate, including a semiconductor substrate such as, e.g., silicon with native oxide or thermally grown oxide, a titanium dioxide layer, etc., to form a brush layer, may be crosslinked with interpolymer crosslinks to form a mat layer, or may form both surface bonds and crosslinks to provide a crosslinked, surface bonded mat layer.

A pattern is formed in the underlayer by overcoating the underlayer with a photosensitive layer such as a photoresist containing a photoacid generator, exposing the photosensitive layer through a pattern mask, heating to diffuse photogenerated acid in the irradiated portions of the photosensitive layer into the underlying underlayer, and removal of the photosensitive layer. The exposure pattern of the photosensitive layer may be closely (densely or semi-densely) spaced features of lines, dashes or dots, a sparse pattern of widely spaced lines, dashes, or dots, or combinations of irradiated features.

The method further involves overcoating the patterned underlayer with a block copolymer, annealing the block copolymer so that one block phase separates to align over the deprotected portions of the underlayer containing the acid-decomposed functional groups. A block of the block copolymer is then removed using e.g., a thermal, photochemical, solvent or plasma method, to create a pattern.

The underlayer comprises an acid sensitive copolymer. The acid sensitive copolymer includes as constituent parts an acid decomposable group, an attachment group, and a functional group.

The relative proportions of the constituent groups are selected such that a desirable balance of properties of these groups, including surface energy and wettability, is obtained for the acid sensitive copolymer before deprotection, and hence for the underlayer prior to any deprotection or in regions where the underlayer is not deprotected. In particular, where the acid sensitive copolymer has not been deprotected, the underlayer including the acid sensitive copolymer has a neutral surface energy toward a self-assembling layer based upon a block copolymer. As used herein, "neutral" means that the surface energy of the underlayer (before deprotection, or in regions where no deprotection has occurred) is substantially the same as that of at least one block of the block copolymer. Further, the proportions of the constituent groups are selected such that a desirable balance of properties including layer neutrality of the underlayer before deprotection, and polarity of the regions of the acid sensitive copolymer after deprotection, is achieved so that a block copolymer disposed on the patterned surface will form phase-separated domains by block, aligned to the polar regions of the surface.

The acid decomposable group is any group that may be chemically decomposed by contact with an acid of sufficient activity. In an embodiment, the acid decomposable group is a $C_{1-30}$ acid decomposable group comprising an ester group, acetal group, ketal group, pyrocarbonate group, or a combination comprising at least one of the foregoing acid decomposable groups. Alternatively, the acid decomposable group may be a crosslinker or crosslinkable group.

In a specific embodiment, the acid decomposable group is a $C_{4-30}$ tertiary alkyl ester. Exemplary $C_{4-30}$ tertiary alkyl groups include 2-(2-methyl)propyl ("t-butyl"), 2-(2-methyl)butyl, 1-methylcyclopentyl, 1-ethylcyclopentyl, 1-methylcyclohexyl, 1-ethylcyclohexyl, 2-methyladamantyl, 2-ethyladamantyl, or a combination comprising at least one of the foregoing. In a specific embodiment, the acid decomposable group is a t-butyl group or an ethylcyclopentyl group.

The attachment group may be any group containing a reactive functional group capable of forming a bond to a substrate. The bond may be an ionic, coordinative (by, e.g., a metal-ligand bond) or covalent bond to a substrate. Preferably, the bond is a covalent bond. The attachment group may be a hydroxy, thiol, or primary or secondary amine substituted, straight chain or branched $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl or a combination comprising at least one of these groups. As used herein, the prefix "hetero" refers to any non-carbon, non-hydrogen atom including, for example, the halogens (fluorine, chlorine, bromine, iodine), boron, oxygen, nitrogen, silicon, or phosphorus, unless otherwise specified. Exemplary attachment groups include 3-aminopropyl, 2-hydroxyethyl, 2-hydroxypropyl, or 4-hydroxyphenyl. Alternatively, or in addition to these functional groups, other reactive functional groups may be included to facilitate bonding of the acid sensitive copolymer to the surface of a substrate. Exemplary such attachment groups include mono-, di- and trialkoxysilane groups such as 3-propyltrimethoxysilane (obtained by the copolymerization of other monomers with trimethoxysilylpropyl(meth)acrylate), glycidyl groups (obtained by the copolymerization with glycidyl(meth)acrylate), or reactive strained rings such as benzocyclobutanes ("BCB," obtained by the copolymerization with, for example, vinyl benzocyclobutane) which may ring open to form reactive dienes which can react with olefinic groups either on the surface of the substrate, or with other ring-opened BCB groups in the polymer to form a dimer. As used herein, "(meth)acrylate" refers to an acrylate, methacrylate, or a combination of these. The attachment group may ionically, coordinatively, or covalently bond to the surface of the substrate, may form an interpolymer crosslink (to form a crosslinked film or mat), or may both covalently bond to the surface of the substrate and form an interpolymer crosslink.

The functional group, included to adjust the neutrality of the acid-sensitive copolymer, may be a straight chain or branched $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl or a combination comprising at least one of these groups. In a specific embodiment, the functional group is aromatic. The functional group may be unsubstituted, or may be substituted with a further functional group including halogen such as fluorine, chlorine, bromine, or iodine; a hydroxy group; an amino group having the structure —N(R')$_2$, where each R' is independently H, cyclic or acyclic $C_{1-30}$ alkyl or $C_{3-30}$ aryl, or fused $C_{2-30}$ alkyl or $C_{3-30}$ aryl; a cyano group; a thiol; a sulfide; a silicon-containing group such as a $C_{1-30}$ alkylsilane, or $C_{6-30}$ arylsilane; a carboxyl containing group such as an aldehyde, ketone, carboxylic acid, ester, or amide; an ether; or a combination comprising at least one of the foregoing. In an exemplary embodiment, the functional group may be a phenyl, 4-methoxyphenyl, hydroxyphenyl, methyl, ethyl, n-propyl, 2-propyl, n-butyl, 2-butyl, isobutyl, or a combination comprising at least one of the foregoing. It will be understood that the acid decomposable groups, attachment groups, and functional groups may be included by copolymerization of corresponding functionalized styrene, olefinic, vinylic, or (meth)acrylate monomers.

In an embodiment, the acid sensitive copolymer has the structure of formula 1:

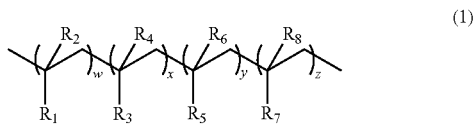
(1)

wherein $R_1$ is a $C_{1-30}$ acid decomposable group comprising a tertiary alkyl ester group, $R_3$ is a $C_{1-30}$ attachment group comprising a hydroxy group, $R_5$ and $R_7$ are independently $C_{1-30}$ functional groups comprising an aromatic group or an ester group, $R_2$, $R_4$, $R_6$ and $R_8$ are independently H or a $C_{1-10}$ organic group, and mole fractions w and x are 0.001 to 0.999 and mole fractions y and z are 0 to less than 0.9, where the sum of mole fractions w, x, y, and z is 1. In a specific embodiment, mole fraction w is 0.05 to 0.65, mole fraction x is 0.35 to 0.95, and mole fractions y and z are 0 to 0.90, where the sum of mole fractions w, x, y, and z is 1.

In a specific embodiment, the acid sensitive copolymer has the structure of formula 2:

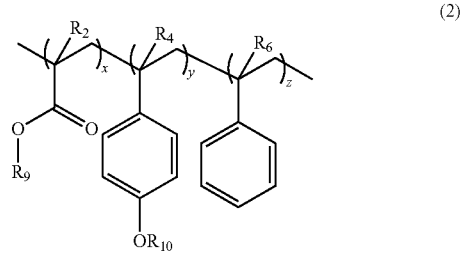
(2)

wherein $R_9$ is a $C_{1-20}$ acid decomposable group comprising a tertiary alkyl ester group, $R_{10}$ is H or a $C_{1-39}$ alkyl group, $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.9, where the sum of mole fractions x, y, and z is 1.

In an exemplary embodiment, the acid sensitive copolymer has formula (3):

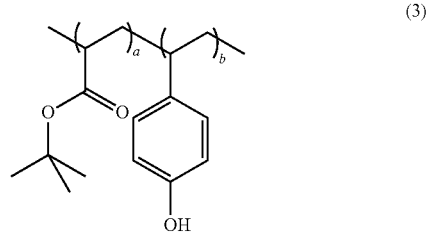
(3)

where mole fraction a is 0.05 to 0.65, and mole fraction b is 0.35 to 0.95, and the sum of mole fractions a and b is 1.

In another exemplary embodiment, the acid sensitive copolymer has formula (4):

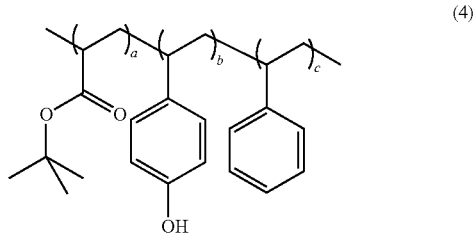
(4)

where mole fraction a is 0.05 to 0.65, mole fraction b is 0.15 to 0.75, and mole fraction c is 0.20 to 0.80, and the sum of mole fractions a, b, and c is 1.

In another exemplary embodiment, the acid sensitive copolymer has formula (5):

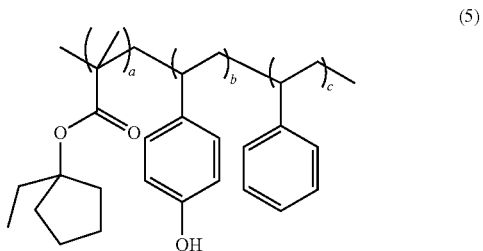
(5)

where mole fraction a is 0.05 to 0.65, mole fraction b is 0.15 to 0.75, and mole fraction c is 0.20 to 0.80, and the sum of mole fractions a, b, and c is 1.

In another exemplary embodiment, the acid sensitive copolymer has the structure of formula (6):

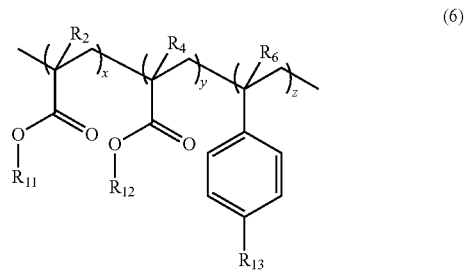
(6)

wherein $R_{11}$ is a $C_{1-20}$ acid decomposable group comprising a tertiary alkyl ester group, $R_{12}$ is a $C_{1-30}$ hydroxy-containing group, $R_{13}$ is H, a $C_{1-10}$ alkyl, or $C_{1-10}$ alkoxy; $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.90, where the sum of mole fractions x, y, and z is 1.

In an exemplary embodiment, the acid sensitive copolymer has the structure of formula (7):

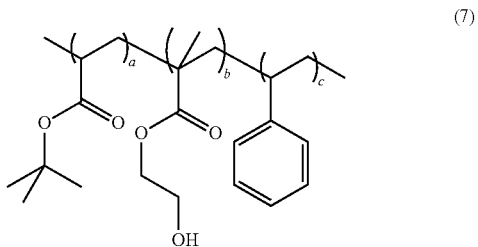
(7)

where mole fraction a is 0.05 to 0.65, mole fraction b is 0.15 to 0.75, and mole fraction c is 0.2 to 0.8, and the sum of mole fractions a, b, and c is 1.

In another exemplary embodiment, the acid sensitive copolymer has the structure of formula (8):

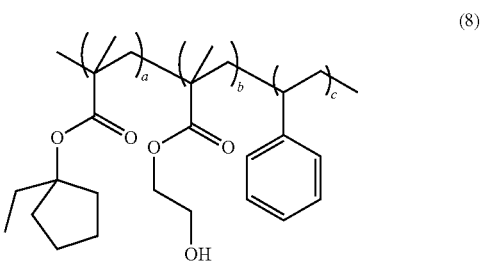
(8)

where mole fraction a is 0.05 to 0.65, mole fraction b is 0.15 to 0.75, and mole fraction c is 0.2 to 0.8, and the sum of mole fractions a, b, and c is 1.

In another exemplary embodiment, the acid sensitive copolymer has the structure of formula (9):

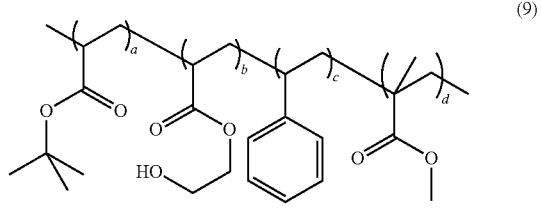

where mole fraction a is 0.05 to 0.65, mole fraction b is 0.15 to 0.75, mole fraction c is 0.2 to 0.8, mole fraction d is 0.1 to 0.6, and the sum of mole fractions a, b, c, and d is 1.

The underlayer is formed by contacting a solution of the acid sensitive copolymer composition to the substrate. In an embodiment, the underlayer is formed by directly disposing the acid sensitive copolymer composition on the substrate surface and effecting a bond to the substrate (e.g., ionic, coordinative, or covalent). Alternatively, in another embodiment, a mat layer covalently or not covalently bonded to the substrate may be used in place of the underlayer. The mat layer may include, in addition to the acid sensitive copolymer, a crosslinking component and as needed, a catalyst. In one embodiment, the crosslinking component may be a crosslinker. An exemplary acid-catalyzed crosslinker includes an alkoxymethylglycoluril crosslinker such as tetramethoxymethyl or tetrabutoxymethyl glycoluril. Where the crosslinker is an acid-catalyzed crosslinker, an acid such as p-toluenesulfonic acid or its ammonium salt, or a thermal acid generator such as the p-nitrophenyl ester of p-toluenesulfonic acid, may be included. Alternatively, the acid sensitive copolymer itself may further include a monomer capable of forming a crosslink with itself or another functional group on another monomer in the polymer, such as a hydroxy or carboxylic acid group. Exemplary such crosslinking monomers include epoxy-containing monomers such as glycidyl(meth) acrylate, or a trialkoxysilane-containing monomer such as trimethoxysilylpropyl(meth)acrylate as recited above. Where a mat layer requiring an additional component is used, the acid sensitive copolymer may be present in an amount of 50 to 100 wt %, specifically 60 to 99 wt %, more specifically 70 to 95 wt %, and still more specifically 70 to 90 wt %. Also in the mat layer, a crosslinker may be present in an amount of 0 to 50 wt %, specifically 1 to 40 wt %, more specifically 5 to 30 wt %, and still more specifically 10 to 30 wt %. A catalyst, where used, may be included in an amount of 0.1 to 5 wt %. All amounts are based on the based on the total solids content of the mat layer.

Contacting of the underlayer may be done by spin coating, spray coating, dip coating, or doctor blading. In an embodiment, the substrate is a semiconductor substrate and contacting is by spin coating. Spin coating comprises dispensing a solution of the acid sensitive brush copolymer onto a surface of the spinning semiconductor substrate. The acid sensitive copolymer is dissolved in a solvent useful for film forming, at a concentration useful for spin-casting and film forming. Exemplary solvents may include, but are not limited to, 1-methoxy-2-propanol, 1-methoxy-2-propyl acetate, ethyl lactate, anisole, cyclohexanone, 2-heptanone, diacetonealcohol, or a combination comprising at least one of the foregoing.

The concentration of the acid sensitive copolymer may be less than or equal to 40 wt %, and in an embodiment, may be from 0.1 to 30 wt %, specifically 0.5 to 20 wt %, and still more specifically 1 to 10 wt %.

Additives to impart or enhance additional properties including underlayer properties or coating properties may be included in the solution of the acid sensitive copolymer. Additives may include additional polymers, photoacid generators, thermal acid generators, surfactants including fluorinated surfactants, polyalkyleneoxy surfactants including polyethylene oxides, polypropylene oxides, and copolymers of these; plasticizers' dissolution rate inhibitors (i.e., compounds insoluble in aqueous base); dissolution rate enhancers (i.e., compounds soluble in aqueous base); crosslinkers; catalysts; photocuring agents; adhesion promoters; amine quencher additives (for limiting diffusion); or a combination comprising at least one of the foregoing additives.

Spin coating, where used, is dependent on the substrate diameter and other factors including film thickness, and may be carried out at a spin speed of 500 to 4000 rpm, specifically 800 to 3000 rpm, and more specifically 1000 to 2500 rpm.

The underlayer is then baked on a hot plate to remove solvent and to condense the film by reducing free volume within the film. Baking of the film may be carried out at a temperature of 50 to 200° C., specifically 60 to 175° C., and more specifically 70 to 150° C. A specific time period for such baking is 30 seconds to 5 minutes, more specifically 30 seconds to 3 minutes, and still more specifically 30 seconds to 2 minutes. The underlayer may further be annealed by baking at a temperature of 100 to 300° C., specifically 125 to 275° C., and more specifically 150 to 250° C. A specific time period for annealing is 5 minutes to 10 hours, more specifically 10 minutes to 8 hours, and still more specifically 15 minutes to 6 hours.

The underlayer is patterned by transferring an acid, generated in an overlying photosensitive layer, into an adjacent portion of the underlayer. Transferring may be done by diffusing by a thermal process. In an embodiment, the method includes disposing a photosensitive layer comprising a photoacid generator on a surface of the underlayer, irradiating the photosensitive layer with actinic radiation in a pattern to generate acid in the exposed areas, and diffusing the acid into the adjacent underlying portions of the underlayer.

Diffusing the acid includes heating the underlayer and photosensitive layer after irradiating portions of the photosensitive layer to create the pattern. The acid sensitive group of the acid sensitive copolymer in the underlayer then reacts with the diffused acid to form a polar region at the surface of the underlayer, the polar region having the shape and dimension of the pattern.

The photosensitive layer may include any photosensitive composition which generates a diffusible acid upon irradiation and which may be subsequently removed. In an embodiment, the photosensitive layer includes a photoacid generator.

Any suitable photoacid generator may be included in the photosensitive layer provided the diffusible acid generated by the photoacid generator in the exposed portions of the photosensitive layer has an intrinsic pKa and mobility (diffusability) within the underlayer (where necessary) that is sufficient to diffuse to, react with and decompose the acid sensitive groups of the underlayer.

The photogenerated acid from decomposition of the photoacid generator may thus have a pKa of less than or equal to 3, specifically less than or equal to 1, and still more specifically less than or equal to 0. The photoacid generator must also be thermally stable to temperatures of up to 250° C. for time periods of up to 10 minutes.

The photoacid generator, included in the photosensitive layer, can in theory generate one equivalent of acid upon absorbance of a quantum of light of an appropriate wavelength, with accompanying by-products. Photoacid generators useful in the photosensitive layer include aryl-based onium salts including mono-, di- and triarylphosphonium salts, mono- and diaryliodonium salts, sulfonate esters including nadimidosulfonates, aromatic ketones such as benzoin derivatives, or a combination comprising at least one of the foregoing. In an embodiment, an aryl-based onium salt such as a mono-, di-, or triarylsulfonium salt or a mono- or diaryliodonium salt having a high thermal stability (relative to, for example, a nadimidosulfonate ester) to baking and annealing is used. Exemplary photoacid generators include triphenylsulfonium, n-octylphenyl(diphenyl)sulfonium, and di-t-butylphenyliodonium salts, or nadimidosulfonate esters, of acids such as methanesulfonic acid, benzylsulfonic acid, trifluoromethanesulfonic acid ("triflic acid"), perfluorobutanesulfonic acid, perfluorobenzenesulfonic acid, trifluoromethylbenzenesulfonic acid, perfluoroethylcyclohexanesulfonic acid, cyclo(1,3-perfluoropropanedisulfonium) imide, or a combination comprising at least one of the foregoing.

Specific examples of useful photoacid generators include triphenylsulfonium triflate, triphenylsulfonium perfluorobutanesulfonate, triphenylsulfonium o-trifluoromethylbenzenesulfonate, triphenylsulfonium perfluorobenzenesulfonate, triphenylsulfonium cyclo(1,3-perfluoropropanedisulfonium) imidate, di-t-butylphenyl iodonium triflate, di-t-butylphenyl iodonium perfluorobutanesulfonate, di-t-butylphenyl iodonium o-trifluoromethylbenzenesulfonate, di-t-butylphenyl iodonium perfluorobenzenesulfonate, or a combination comprising at least one of the foregoing.

The photosensitive layer is irradiated in a pattern with actinic radiation. Actinic radiation, useful to generate acid by the photoacid generator, is used, where it will be appreciated that the photoacid generator used in the photosensitive layer is sensitive to the radiation wavelength used. The actinic radiation may be, for example, ultraviolet (UV) light having a wavelength of 10 to 400 nm, specific examples of which are i-line radiation of 365 nm, deep ultraviolet (DUV) radiation at 248 nm, 193 nm, 157 nm, and extreme UV radiation of 10-15 nm; x-rays; or electron beam (e-beam).

In a specific embodiment, the photosensitive layer is a photoresist comprising a photoacid generator. The photoresist may be, for example, a DUV photoresist or a 193 nm photoresist irradiated at a wavelength of 248 nm or 193 nm, respectively.

The pattern formed on the photosensitive layer by irradiating may have features which form a regular pattern with a dense pitch, i.e., a ratio of linewidth to space width of 1:1 or more (e.g., 1.1:1, 1.2:1, 1.5:1, 2:1, etc.), a semi-dense pitch of less than 1:1 (e.g., 1:1.5) or a sparse pattern having a pitch of 1:2 or less (e.g., 1:3, 1:4, etc.).

A sparse pattern can be formed on the neutral surface of the underlayer using low resolution techniques such as patterns of dashes or dots, rather than using contiguous patterns as would be obtained using unbroken lines. Upon forming the domains on these patterns, the domains align to dashes and/or dots as well as to lines, and due to the ability of domains to align with regularity of size and shape to domains formed on the intermittent patterned regions, the aligned domains can form patterns comparable to those formed on contiguous patterns.

Advantageously, use of lines or dashes with high line-edge roughness and line-width roughness can correct defects in domain alignment in a "self-healing" mechanism during annealing. In addition, for applications involving electron-beam lithography, writing dashed lines and/or dotted lines takes less writing time (and/or requires a lower energy dose) than writing a solid line. Thus, in an embodiment, an irradiated region of the photosensitive layer can be non-contiguous, comprising dashes and/or dots. The spacing and alignment of the dashes and/or dots are such that domains formed on the non-contiguous pattern assemble to form a contiguous pattern of domains with a minimum of defects.

In an embodiment, where a photosensitive layer is used, the acid generated in the photosensitive layer is then diffused into a corresponding underlying portion of the underlayer. The step of diffusing is carried out by thermal processing at a temperature and for a time such that the lateral (i.e., in the plane of the substrate) and vertical (i.e., perpendicular to the plane of the substrate) diffusion is controlled to create a transfer of acid directly correlating to the surface x-y dimensions of the irradiated portion comprising the pattern in the photosensitive layer.

In an embodiment, thermal processing to diffuse the acid between the photosensitive layer and the underlayer may be carried out by hot plate, by oven/furnace, or other such heating methods. Preferably, thermal processing is carried out by heating on a hot plate in a wafer processing and coating track. Heating by hot plate may be carried out under air or in an inert atmosphere such as under nitrogen or helium. Thermal processing may be carried out at ambient temperatures up to 250° C., for time periods of several seconds to several hours, depending on the temperature and the diffusion requirements. In a specific embodiment, where thermal processing is carried out on a hot plate, the substrate is heated at 70 to 250° C., specifically 75 to 200° C., more specifically 80 to 175° C., and still more specifically 90 to 150° C. Time periods for such thermal processing may be from 10 seconds to 10 minutes, more specifically 20 seconds to 5 minutes, still more specifically 30 seconds to 3 minutes, and still more specifically 30 seconds to 2 minutes.

After diffusing the photogenerated acid from the photosensitive layer, the photosensitive layer is removed from the surface of the underlayer. Such removal may be accomplished by wet methods such as stripping or developing, or by dry methods such as ashing using a plasma such as an oxygen, nitrogen, or argon plasma, or other plasma, or by selective photolytic degradation followed by either a wet or dry method. In an embodiment, the step of removing comprises contacting the photosensitive layer with a stripper comprising an organic solvent, an aqueous base solution, or a combination comprising at least one of the foregoing.

The acid diffused into the underlayer in the exposed regions then decomposes the acid decomposable groups in the diffused portion of the acid sensitive copolymer to form polar groups defining the polar regions of the patterned underlayer. The regions on the patterned underlayer not exposed to photogenerated acid (i.e., those regions of the underlayer where acid was not diffused) remain neutral. In an alternative embodiment, the acid diffused into the underlayer in the exposed regions may act to catalyze formation of a neutral region by, for example, crosslinking, and the unexposed regions may be polar.

A self-assembling layer is then formed on a surface of the patterned underlayer. The self-assembling layer comprises a block copolymer having a first block with an affinity for the polar region of the underlayer, and a second, dispersive (also referred to as "neutral") block without an affinity for the polar region of the underlayer. As used herein, "with an affinity for" means that the first block is surface-energy matched to the polar region and is attracted to the polar region, so that during casting and annealing, the mobile first block deposits selectively on and aligns to the polar region. In this way, the first block forms a first domain on the underlayer that is aligned to the polar regions of the underlayer (i.e., is aligned to the pattern formed by decomposition of the acid decomposable groups). Similarly, the second, dispersive block of the block copolymer, which has less affinity for the polar region of the underlayer, forms a second domain on the underlayer aligned adjacent to the first domain. "Domain", as used herein, means a compact crystalline or semi-crystalline region formed by corresponding blocks of the block copolymer, where these regions may be lamellar or cylindrical and are formed orthogonal to the plane of the surface of the underlayer and in at least partial contact with the underlying surface of the underlayer. In an embodiment, the domains may have a shortest average dimension of 1 to 100 nm, specifically 5 to 75 nm, and still more specifically 10 to 50 nm.

The blocks can in general be any appropriate domain-forming block to which another, dissimilar block can be attached. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, or organometallic polymers prepared from polymerizable organometallic monomers based on Fe, Sn, Al, or Ti, such as poly(organophenylsilyl ferrocenes).

In an embodiment, the blocks of the block copolymer comprise as monomers $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene; and can include as (meth)acrylate monomers, methyl(meth)acrylate, ethyl(meth)acrylate, n-propyl(meth)acrylate, isopropyl(meth)acrylate, n-butyl(meth)acrylate, isobutyl(meth)acrylate, n-pentyl(meth)acrylate, isopentyl(meth)acrylate, neopentyl(meth)acrylate, n-hexyl(meth)acrylate, cyclohexyl(meth)acrylate, isobornyl (meth)acrylate, or hydroxyethyl(meth)acrylate. Combinations of two or more of these monomers can be used.

Exemplary blocks which are homopolymers can include blocks prepared using styrene (i.e., polystyrene blocks), or (meth)acrylate homopolymeric blocks such as poly(methylmethacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Useful block copolymers include at least two blocks, and may be diblock, triblock, tetrablock, etc. copolymers having discrete blocks, each of which block may be a homopolymer, or random or alternating copolymer. Exemplary block copolymers include polystyrene-b-polyvinyl pyridine, polystyrene-b-polybutadiene, polystyrene-b-polyisoprene, polystyrene-b-polymethyl methacrylate, polystyrene-b-polyalkenyl aromatics, polyisoprene-b-polyethylene oxide, polystyrene-b-poly(ethylene-propylene), polyethylene oxide-b-polycaprolactone, polybutadiene-b-polyethylene oxide, polystyrene-b-poly(t-butyl(meth)acrylate), polymethyl methacrylate-b-poly(t-butyl methacrylate), polyethylene oxide-b-polypropylene oxide, polystyrene-b-polytetrahydrofuran, polystyrene-b-polyisoprene-b-polyethylene oxide, poly(styrene-b-dimethylsiloxane), poly(methyl methacrylate-b-dimethylsiloxane), poly(methyl(meth)acrylate-r-styrene)-b-polymethyl methacrylate, poly(methyl(meth)acrylate-r-styrene)-b-polystyrene, poly(p-hydroxystyrene-r-styrene)-b-polymethyl methacrylate, poly(p-hydroxystyrene-r-styrene)-b-polyethylene oxide, polyisoprene-b-polystyrene-b-polyferrocenylsilane, or a combination comprising at least one of the foregoing block copolymers.

The block copolymer desirably has an overall molecular weight and polydispersity amenable to further processing. In an embodiment, the block copolymer has a weight-averaged molecular weight (Mw) of 10,000 to 200,000 g/mol. Similarly, the block copolymer has a number averaged molecular weight (Mn) of 5,000 to 200,000. The block copolymer can also have a polydispersity (Mw/Mn) of 1.01 to 6. In an embodiment, the polydispersity of the block copolymer is 1.01 to 1.5, specifically 1.01 to 1.2, and still more specifically 1.01 to 1.1. Molecular weight, both Mw and Mn, can be determined by, for example, gel permeation chromatography using a universal calibration method, and calibrated to polystyrene standards.

The block copolymer is, in an embodiment, spin cast from a solution onto the patterned surface of the underlayer to form a self-assembling layer on the surface of the underlayer. The block copolymer is heated to a temperature of up to 250° C. or higher for up to 8 hours or more to both remove solvent and form the domains in an annealing process. The domains form where the first block forms a first domain on the underlayer aligned to the polar regions, and the second block forms a second domain on the underlayer aligned adjacent to the first domain. Where the irradiated portion of the underlayer forms a sparse pattern, and hence polar regions, spaced at an interval greater than an interval spacing of the first and second domains, additional first and second domains form on the underlayer to fill the interval spacing of the sparse pattern. The additional first domains, without a polar region to align to, instead align to the previously formed second (dispersive) domain, and additional second domains align to the additional first domains.

A relief pattern is then formed by removing either the first or second domain to expose an underlying portion of the underlayer. In an embodiment, the step of removing is accomplished by a wet etch method, developing, or a dry etch method using a plasma such as an oxygen plasma.

An exemplary method of an embodiment is illustrated in FIG. 1A-1J. While the embodiment shown below is that of a brush layer, it will be appreciated that the underlayer may alternatively be a mat layer comprising an acid sensitive copolymer and a crosslinker, and which may or may not be bonded to the substrate. FIG. 1A shows an unmodified semiconductor substrate 100 having hydroxy groups 102 bonded to the substrate material 101. In an embodiment, the hydroxy groups 102 are replaceable hydroxy groups, such as Si—OH (where the substrate includes $SiO_2$) or Ti—OH groups (where the substrate includes $TiO_2$).

Figure 1B:
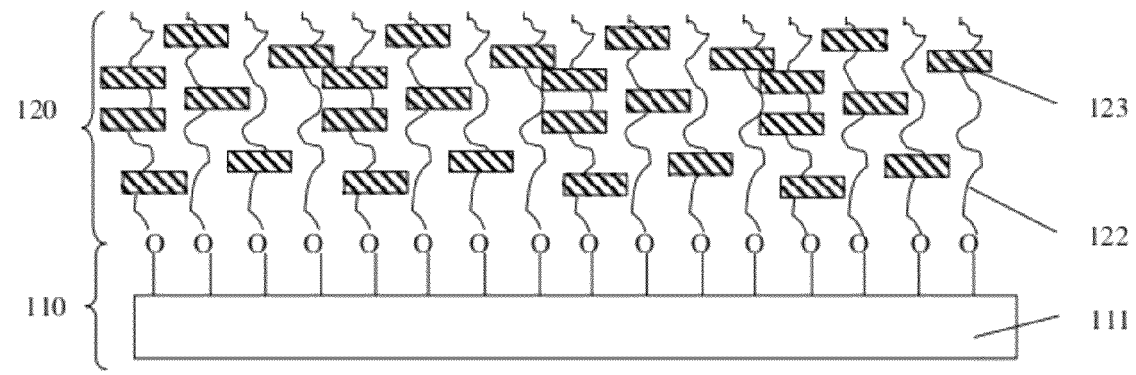

The polymer brush is then attached to the substrate, by a covalent bond. FIG. 1B shows the modified semiconductor substrate 110, in which the semiconductor material 111 has been modified to include an acid sensitive copolymer 122 having acid sensitive groups 123, and connected through alkoxy linkages to the semiconductor material 111 to form a underlayer 120. Attachment of the acid sensitive copolymer is accomplished by, for example, spin casting a solution of the acid sensitive copolymer which comprises, in addition to the acid sensitive groups 123, an attachment group having at least one hydroxy group (not shown) as a terminal group of the polymer backbone or as a terminal group in a side chain of the acid sensitive polymer (e.g., where the acid sensitive copolymer comprises hydroxystyrene monomer or 2-hydroxyethyl methacrylate (HEMA) monomer).

The acid sensitive copolymer is bonded to the surface by heating to remove solvent and to effectuate boding by e.g., displacement of the hydroxy group (102 in FIG. 1A) by a hydroxy group of the acid sensitive copolymer. For example, the bond formed may be an Si—O—R bond where R is the acid sensitive copolymer. In this way, for example, the bond formed may be an Si—O—R bond where R is the acid sensitive copolymer. Heating to bond the underlayer 220 may be carried out at any temperature and time suitable to bond the acid sensitive polymer 122 to the semiconductor material 111. For example, bonding may be carried out on a hot plate at a temperature of 70 to 250° C., for a time of 30 seconds to 2 minutes.

It will be appreciated that additional or alternative motifs for the bonding of the acid sensitive polymer may be used, such as for example, attachment via epoxy groups, ester groups, amide groups, siloxane group, or (meth)acrylate groups, where these functional groups may also be present in the acid sensitive copolymer or may be attached to the surface of the substrate by a surface treatment. Such exemplary surface treatments may include alpha-omega bifunctional compounds such as functional mono-, di- and trialkoxysilanes including methyldimethoxysilylpropyl acrylate, trimethoxysilylpropyl acrylate, trimethoxysilylpropyl acrylate, trimethoxysilylpropyl(meth)acrylate, glycidylpropyltrimethoxy silane, or 2,3-epoxycyclohexylethyltrimethoxy silane.

Any residual acid sensitive copolymer not attached to the substrate 110 is then washed from the surface of the underlayer 120 by successive washings with a solvent. Solvents for washing may include any solvent non-damaging to the functional groups or which would undesirably result in displacement of the bonded acid sensitive copolymer 122. Exemplary solvents may include toluene, anisole, PGMEA, cyclohexanone, or any solvent capable of removing the residual acid sensitive copolymer. It is understood that where residual acid sensitive copolymer remains on the surface, the residual acid sensitive copolymer can become entrained in a subsequently applied self-assembling layer which may fail to form phase-separated domains as a result.

Figure 1C:
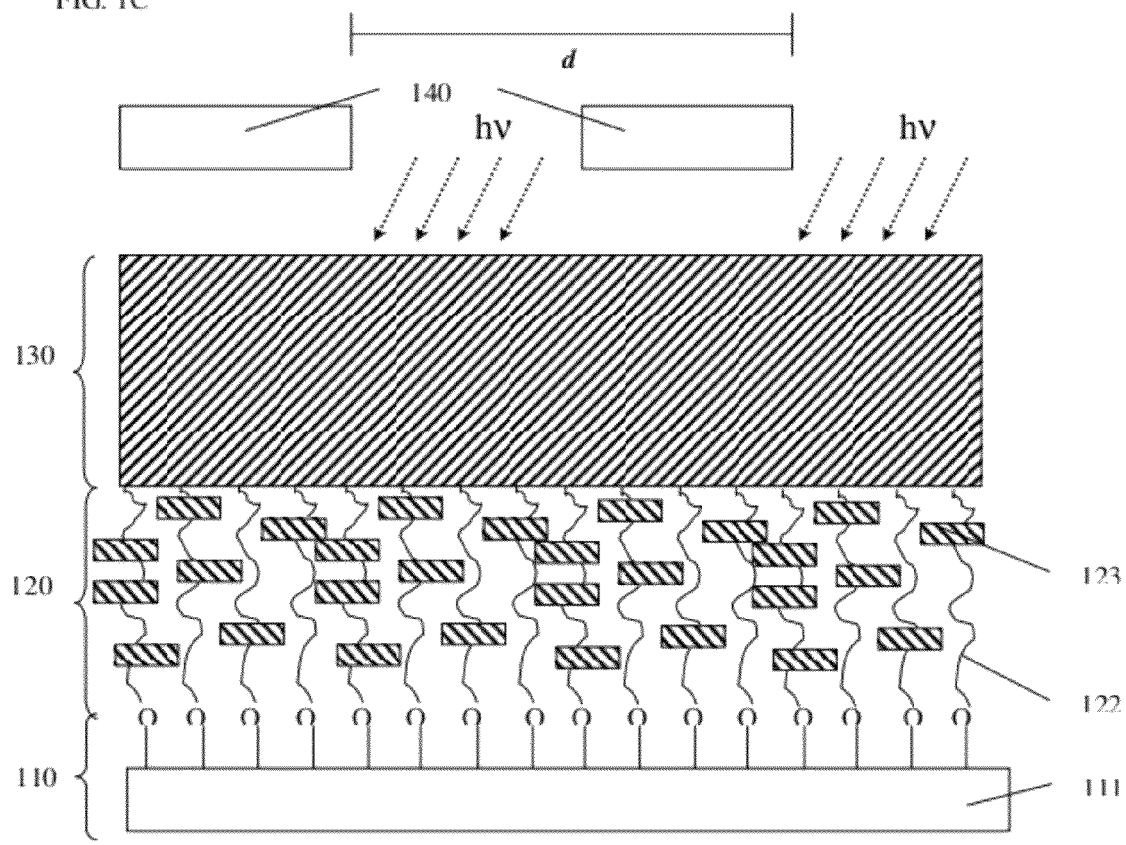

The underlayer 120 is then patterned by irradiation with actinic radiation. As illustrated in FIG. 1C, in this embodiment, a photosensitive layer 130 is disposed on a surface of the underlayer 120, and irradiated through a reticle or mask 140 to form a pattern of irradiation in the photosensitive layer 130. The photosensitive layer 130 contains photoacid generators (not shown) which can decompose to form acid upon irradiation. The photosensitive layer 130 may be a photoresist sensitive to the actinic radiation used. For example, where irradiation is done with 193 nm wavelength UV light through a mask, the photosensitive layer 130 may be a positive tone 193 nm photoresist. Irradiation may alternatively be done by a direct write method such as by e-beam (where the photosensitive layer 130 is sensitive to e-beam radiation), or may be accomplished by other optical techniques such as interferometry. Also in FIG. 1C (and subsequent FIGS. 1D to 1J), d represents the interval width across the irradiated surface of a repeating portion of the irradiated pattern including both irradiated and non-irradiated regions.

Figure 1D:
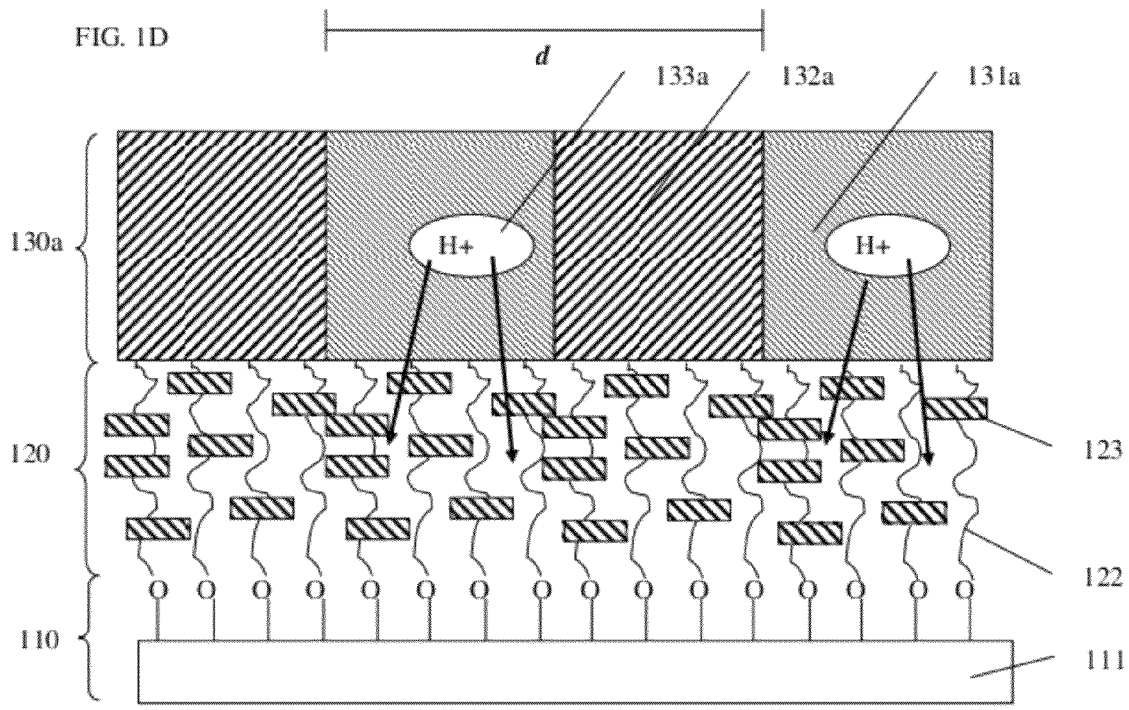

FIG. 1D illustrates the structure of FIG. 1C after irradiation. In FIG. 1D, the irradiated photosensitive layer 130a includes non-irradiated portions 132a and irradiated portions 131a. After irradiation, the photoacid generator contained in the irradiated portions 131a decomposes to form acid 133a (H+) which is then diffused into adjacent regions of the underlayer 120, interpenetrating the acid sensitive copolymer 122 and interacting with acid sensitive groups 123. Diffusing is effected by baking the irradiated structure of layers 110, 120, and 130a, for example, on a hot plate at a temperature of 80 to 140° C., and for a time of 10 to 120 seconds. An oven may also be used. During the bake step, the acid 133a randomly diffuses in all directions, including into the underlying adjacent portions of the underlayer 120. It will be appreciated that the time and temperature of the baking step for diffusion will be determined by the acid generated during the irradiation. For example, if the acid generated has a small hydrodynamic volume (e.g., trifluoromethanesulfonic acid), the bake temperature may be lower and/or the bake time may be shorter than that used where the acid generated during irradiation has a relatively larger hydrodynamic volume (e.g., perfluorobutanesulfonic acid). It will also be appreciated that the acid 133a need not diffuse completely through the underlayer 120 but need only penetrate the underlayer to a degree sufficient to interact with acid sensitive groups at or near the surface of the underlayer 120, sufficient to affect the surface energy in the region of the underlayer 120 contacted by the acid 133a.

Figure 1E:
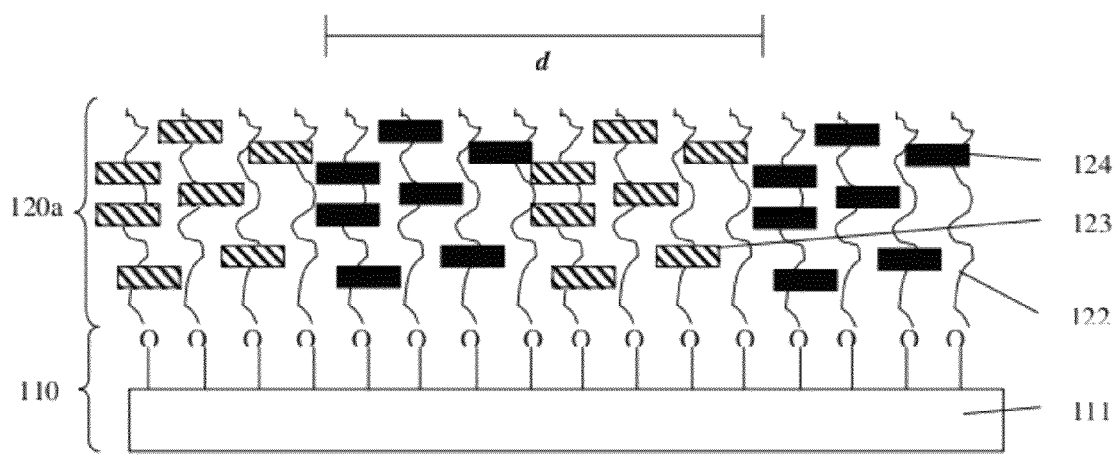

FIG. 1E shows the patterned underlayer 120a after diffusion of the acid and decomposition of the acid decomposable groups 123 to form polar groups 124 in the diffusion region which correspond to the overlying irradiated region illustrated in FIG. 1D. "Correspond(s) to" or "corresponding to", as used herein, mean that the diffusion regions of patterned underlayer 120a are of the same shape and interval d as the irradiated regions 131a of the photosensitive layer 130a in FIG. 1D.

Figure 1F:
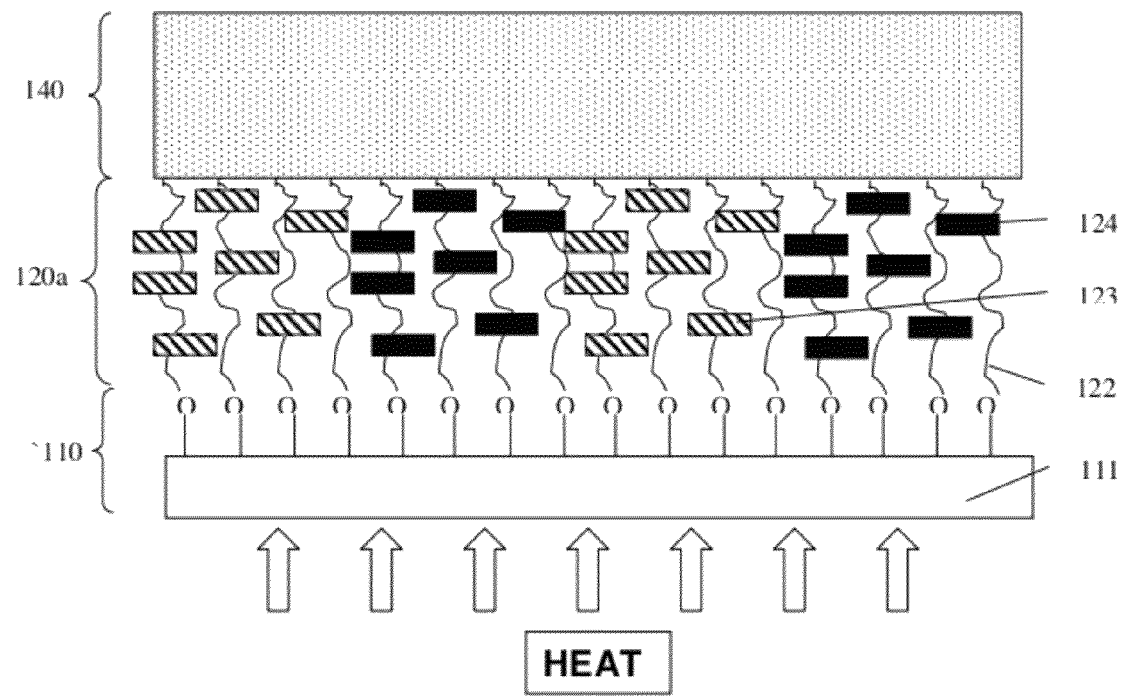

FIG. 1F next illustrates the disposition of a self-assembling layer 140 on a surface of the patterned underlayer 120a. The self-assembling layer 140 may comprise a block copolymer with blocks having different surface energies, where the blocks phase-separate and at least one block forms a discrete domain aligned to the pattern, i.e., the region of the patterned underlayer 120a having the polar groups 124. The self-assembling layer 140 is applied as a solution by spin-casting from a solvent, and after casting is heated by baking to both remove residual solvent and to compact and anneal the self-assembling layer. It is believed that domain formation, which requires mobility of the polymer chains to order the blocks of the block copolymer, occurs simultaneously with the loss of plasticizing solvent during heating and with ordering of the chains of the individual blocks to form ordered cylindrical or lamellar structures.

Figure 1G:
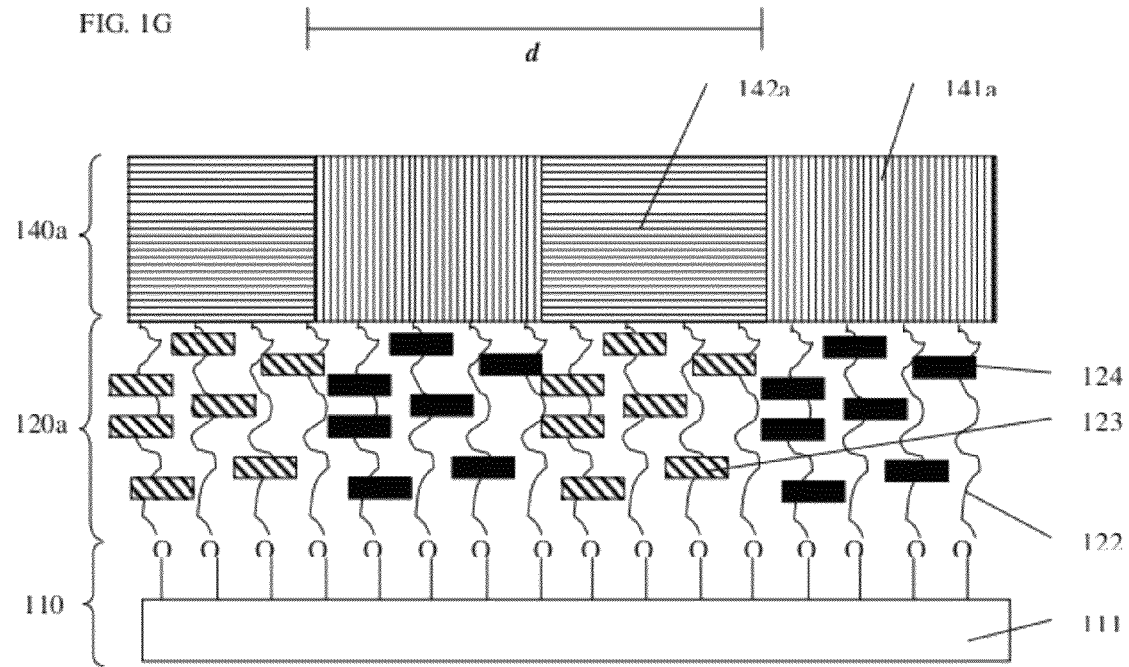

FIG. 1G illustrates the patterned self-assembled layer 140a having polar domains 141a aligned to the polar regions (with polar groups 124) of patterned underlayer 120a, and neutral domains 142a aligned to polar domains 141a and to the neutral regions (with undecomposed acid decomposable groups 123) of pattern underlayer 120a.

The interval of the irradiated regions is denoted by d in FIG. 1C to FIG. 1J, where d represents the interval width across the irradiated surface of a repeating portion of the irradiated pattern including both irradiated and non-irradiated regions. FIG. 1G exemplifies a pattern with interval d which corresponds to the width w (not shown) of combined domains 141a and 142a. In another embodiment of a pattern, illustrated in FIG. 1H, a sparse pattern may be used, i.e., one where the original irradiated pattern width d is greater than that of the combined widths w of the domains (e.g., 1:2 (d:w), 1:3 (d:w), 1:4 (d:w), etc), rather than one which corresponds 1:1 (d:w) with the combined widths of the domains. Thus, it will be appreciated that the interval d may coincide with the width w of the combined domains or may exceed the width w (see e.g., FIG. 1H, which illustrates a 1:2 (d:w) ratio).

Figure 1H:
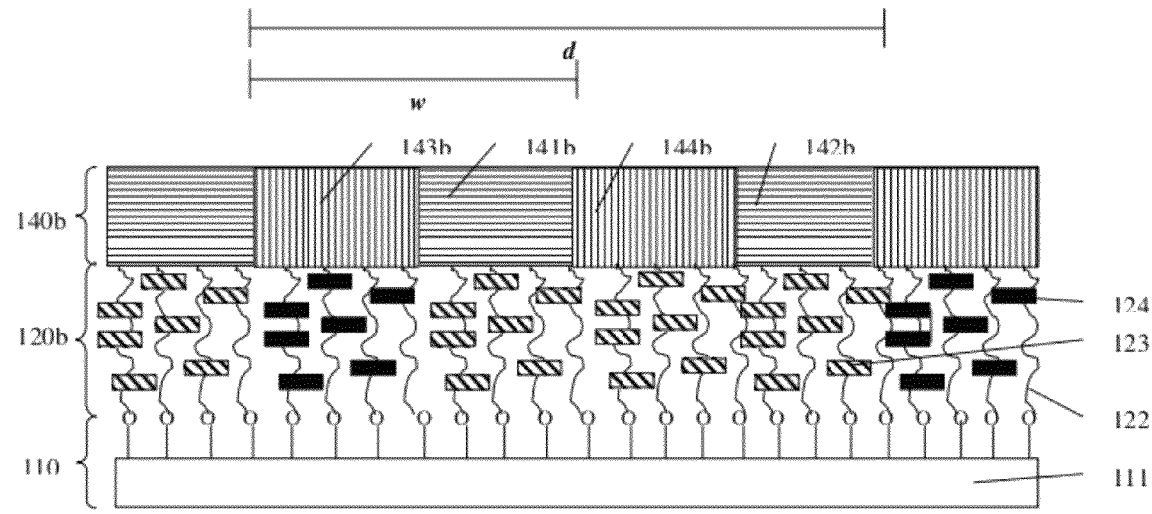

In FIG. 1H, where the sparse pattern is used, a polar domain 143b of self-assembled layer 140b aligns to the polar region (having polar groups 124) of sparsely patterned underlayer 120b, and a nonpolar domain 141b aligns to the polar domain 143b. A second polar domain 144b aligns to the nonpolar domain 141b, where insufficient polar region of the sparsely patterned underlayer 120b is present, and another nonpolar domain 142b aligns to the second polar domain 144b. The pattern is then repeated across the wafer. In this way, a sparse pattern can be used as a guide, in combination with the domain-forming tendencies of the self-assembling block copolymer, to multiply the pattern without need for irradiating and transferring the complete pattern to the underlayer. This method is especially efficient where dense line/space resolution is difficult to obtain in the irradiation step, or where the irradiation step is a lengthy and time-consuming step (e.g., where e-beam direct writing is used).

Figure 1I:
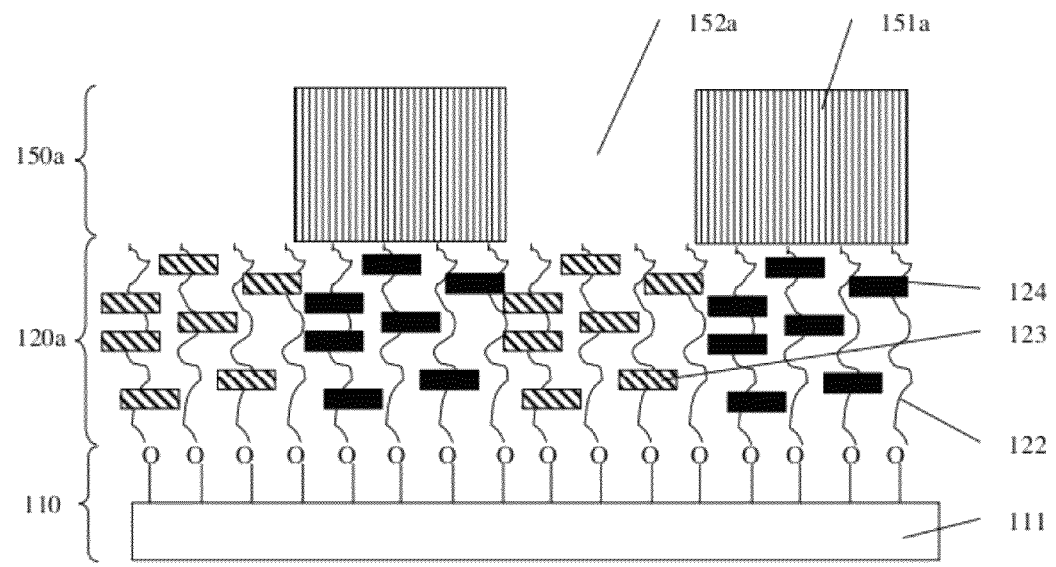

FIG. 1I illustrates the formation of the pattern. A domain in the self-assembled layer 140a from FIG. 1G (or similarly, 140b from FIG. 1H) is selectively removed to form a pattern layer 150a having positive regions 151a and spaces 152a.

Figure 1J:
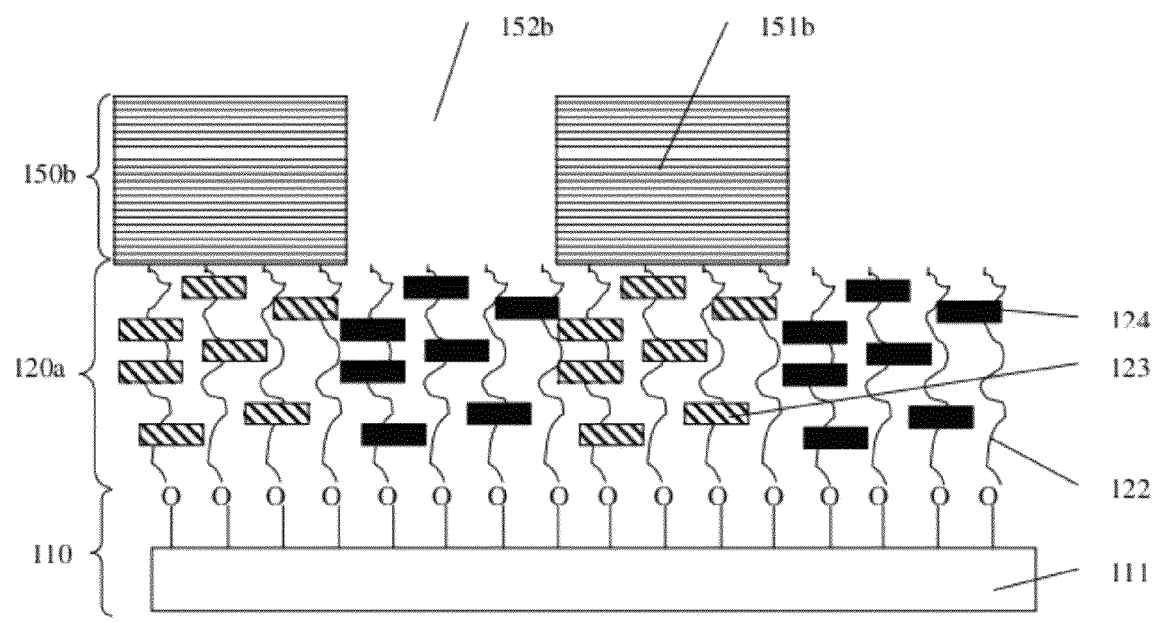

In either of FIG. 1I or 1J, the underlying nonpolar region (FIG. 1I) or polar region (FIG. 1J) of the brush copolymer layer 120a may also be removed. Removal may be by a wet chemical treatment including dissolving the blocks, wet etching, or developing using an acid or base developer, or may be accomplished by a selective dry etching process.

The above methods and structures may be used in the manufacture of semiconductor devices including memory devices requiring dense line/space patterns such as synchronous dynamic random access memory (SDRAM) or dense features for data storage such as in hard drives. It will be appreciated that such devices are meant to be illustrative and should not be construed as limited thereto.

The invention is further illustrated by the following examples.

All polymer compositions evaluated as underlayers were prepared as described hereinbelow, except for polyhydroxystyrene (PHS), having an Mw of 10,000 to 25,000 and a polydispersity (Mw/Mn) of less than 2, obtained from Maruzen Corporation. The polymer composition was characterized by $^{13}C$ nuclear magnetic resonance (NMR) spectroscopy and by gel permeation chromatography (GPC). NMR spectra were collected using samples dissolved in chloroform-d or acetone-$d_6$ with 0.9% chromium (III) acetylacetonate as a relaxation agent, with $^1H$ spectral data obtained using a 400 MHz Varian INOVA spectrometer with 10 second pulse delay, and $^{13}C$ spectral data obtained using a 300 MHz Varian INOVA or 400 MHz Bruker AVANCE 400 NMR spectrometer with a cryoprobe and 5 second pulse delay.

Random copolymers of styrene, methyl methacrylate (MMA), hydroxyethylmethacrylate (HEMA), and tert-butyl acrylate (tBA) were synthesized in tetrahydrofuran (THF) at 30 wt % solids via free radical polymerization. All copolymers were produced using the following procedure. The monomers were charged and the reaction mixture was degassed for 30 min., then allowed to equilibrate at 50° C. Upon equilibration, 80% of the targeted 1.50 mol % of VAZO 52 initiator was added. The reaction was heated to 67° C. for 1 h, after which the remaining 20% of the initiator was added. Temperature was maintained overnight under reflux. The polymer was subsequently isolated by precipitating into a 96:4 (w/w) ratio heptane/isopropanol (IPA) solution and the polymer was collected by filtration and dried to constant mass. When the tBA content of the polymer was greater than 12 mol %, the heptane/IPA mixture was cooled with dry ice for at least 1 h prior to precipitation.

The number-average molecular weight ($M_n$) and molecular weight distribution ($M_w/M_n$) of the polymers were determined by gel permeation chromatography, using a crosslinked styrene-divinylbenzene column calibrated with polystyrene standards, and a sample concentration of 1 mg/ml, with THF as eluant at a flow rate of 1 ml/min at 35° C.

The polystyrene-b-poly(methyl methacrylate) ("PS-b-PMMA") copolymer used in the study as the self-assembling copolymer was synthesized by anionic polymerization as follows. An oven dried 1-liter, 3 necked round bottom flask was vacuum/purged with nitrogen and equipped with a magnetic stir bar, nitrogen/vacuum inlet, thermowell and a septum port. To the flask, dry THF (400 mL) and purified styrene (27.8 g, 0.27 mole) was added via cannula and the mixture was cooled to −70° C. Sec-butyllithium (0.71 g of a 0.47 mmole/g solution) was added quickly via cannula and there was an immediate exotherm to −40° C. The reaction mixture turned an orange/red color. The reaction continued for 30 minutes, and diphenylethylene (0.21 g, 1.22 mmole), dissolved in ~5 mL dry THF and then added to the reaction whereupon the reaction immediately turned a dark red color. After 30 minutes, a solution of methyl methacrylate (12.79 g, 0.13 mole) in 20 mL of dry THF was added to the −70° C. reaction mixture, with subsequent exotherm to −62° C. accompanied by a color change from dark red to light yellow. After 30 minutes, 2 mL anhydrous methanol was added to quench the reaction. The polymer solution was allowed to warm to ambient temperature and the reaction mixture poured into 1400 mL of stirring methanol. The precipitated solid was isolated by filtration and dried in a vacuum oven at 60° C. for 16 hours to constant weight, yielding 23 g (57% yield) of the polymer as a white polymer.

The (meth)acrylate polymers were dissolved in 2-heptanone (2 wt % based on the total solution weight) and cast on an unprimed 30 cm silicon wafer at 1500 rpm for 30 seconds, followed by a soft bake at 150° C. for 60 seconds to remove solvent and condense the film. The underlayer is further processed in an annealing step by baking on a hot plate at 160° C. for 4 hours, to covalently bond the acid-decomposable (meth)acrylate polymer to form the underlayer. The underlayer was subsequently rinsed with 2-heptanone twice to remove any unbonded acid decomposable (meth)acrylate polymer. Measurement of the thickness of the resulting underlayer by atomic force microscopy (AFM) showed a film thickness of 6-7 nm.

Contact angle was measured on a KRÜSS DSA Measurement Tool by the Sessile prop method using both water (18 ohm deionized water) and methylene iodide ($CH_2I_2$). Surface energy including both polar and dispersive components was calculated from the contact angles of each of these solvents using Fowke's method (a variant of the Owens-Wendt method). The surface energy results are reported in units of millijoules per square meter ($mJ/m^2$).

Exemplary acid sensitive (meth)acrylate copolymers Ex. 1 to 4 and comparative copolymer CEx. 3 were prepared by radical polymerization according to the above method from styrene, 2-hydroxyethyl methacrylate, methyl methacrylate, and/or t-butyl acrylate in the molar proportions in Table 1.

Note that the polyhydroxystyrene (PHS) for CEx. 1 was used as obtained commercially, and that the polystyrene-b-poly (methyl methacrylate) diblock copolymer CEx. 2 was prepared by the above described method.

TABLE 1

| Example | Underlayer Polymer Composition (mol %) | | | | | Molecular Weight (g/mol) | | Contact angle (°) | | Surface energy (mJ/m$^2$) | | |
|---|---|---|---|---|---|---|---|---|---|---|---|---|
| | PHS | STY | HEMA | MMA | t-BA | Mn | PD | water | CH$_2$I$_2$ | dispersive | polar | (dispersive/polar) |
| CEx. 1 | 100 | — | — | — | — | — | — | 84 | 30.8 | 37 | 7 | 0.16 |
| CEx. 2$^a$ | — | 77 | — | 23 | — | 173,000 | 1.17 | 87.2 | 35.2 | 36 | 6 | 0.14 |
| Ex. 1 | — | 74 | 9 | 5 | 12 | 27,500 | 2.28 | 82.5 | 42.2 | 31 | 9 | 0.22 |
| Ex. 2 | — | 54 | 21 | 8 | 17 | 18,300 | 1.80 | 81.3 | 45.8 | 29 | 10 | 0.26 |
| Ex. 3 | — | 77 | 2 | — | 21 | 15,200 | 1.29 | 85.7 | 35.2 | 36 | 7 | 0.16 |
| Ex. 4 | — | 25 | 10 | — | 65 | 6,893 | 1.87 | 84.7 | 55.5 | 25 | 10 | 0.28 |
| CEx. 3 | — | 68 | 1.5 | 32 | — | 41,900 | 2.36 | 82.5 | — | — | — | — |

$^a$Poly(styrene-b-methyl methacrylate) copolymer.

Brush layers were prepared as described above for the polymers in Table 1. As seen in Table 1, a polymer having a composition of 100% polyhydroxystyrene (CEx. 1) and which does not include an acid decomposable group, exhibits dispersive and polar surface energies and a polarity ratio comparable to that of an exemplary diblock copolymer of polystyrene-b-poly(methyl methacrylate), used in a self-assembling layer (CEx. 2). Examples 1-4 each include acid decomposable groups (tBA), a dispersive functional group (styrene, abbreviated STY), and a hydroxy-functionalized reactive group (2-hydroxyethyl methacrylate, abbreviated HEMA), and Examples 1 and 2 each further included a filler monomer (methyl methacrylate, abbreviated MMA). CEx. 6 contains STY, HEMA, and MMA but no tBA. It can be seen in Exs. 1, 2, and 4 that inclusion of higher amounts (10 mol % or more) of HEMA increases the polar component of the surface energy resulting in these copolymers deviating from a close match with CEx. 2 on the dispersive and polar surface energies, and resulting polarity ratios, and hence Exs. 1, 2, and 4 are non-neutral and form a non-neutral surface with respect to the control CEx. 2.

However, the composition of Ex. 3 has the same dispersive surface energy (36 mJ/m$^2$) and similar polar surface energy (7 mJ/m$^2$ for Ex. 3, compared with 6 mJ/m$^2$ for CEx. 2) and polarity ratio (0.16 for Ex. 3, compared with 0.14 for CEx. 2), and hence CEx. 2 and Ex. 3 are closely matched and neutral toward one another.

The terpolymer of Example 3, having the following structure:

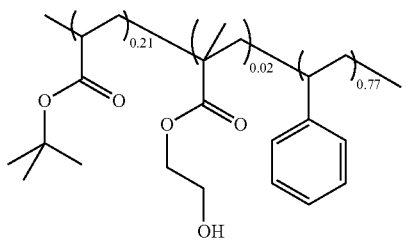

was dissolved in 2-heptanone (2 wt % based on total solution weight) was coated as described above to form a brush layer. A 193 nm photoresist was used to acid treat the underlayer. Over the underlayer, the photoresist (EPIC™ 2340 photoresist, available from Rohm and Haas Electronic Materials) was applied to a 180 nm film thickness and baked at 110° C. for 60 seconds. The wafers were then exposed using a binary reticle consisting of an array of 180 nm contact holes at a 360 nm pitch across a 6.6 mm×6.6 mm field size. Contact hole exposure utilized annular illumination at a maximum numerical aperture (NA) of 0.75 for the exposure tool (ASML PAS 5500/1100 193 nm scanner, manufactured by ASML). After exposure, the photoresist post exposure baked at 120° C. for 60 seconds, followed by developing in 0.26 N tetramethylammonium hydroxide for 60 seconds. The photoresist was subsequently removed using 2-heptanone.

Next, the block copolymer of CEx. 2, having the general structure:

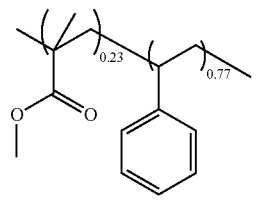

was dissolved in 2-heptanone (2 wt % based on total solution weight) and was spin cast to a thickness of about 100 nm on the 30 cm wafer previously coated with the underlayer comprising the polymer of Example 3 and imaged by the above method, and baked at 250° C. for 30 minutes to anneal the self-assembling layer and provide phase-separated domains as cylinders.

The PS-b-PMMA copolymer structures were analyzed using atomic force microscopy (AFM) in tapping mode at a scanning rate of 0.5 Hz and a drive frequency of ~270 Hz. The d-spacing of detected features was determined from a power spectral density (PSD) profile.

Figure 2:
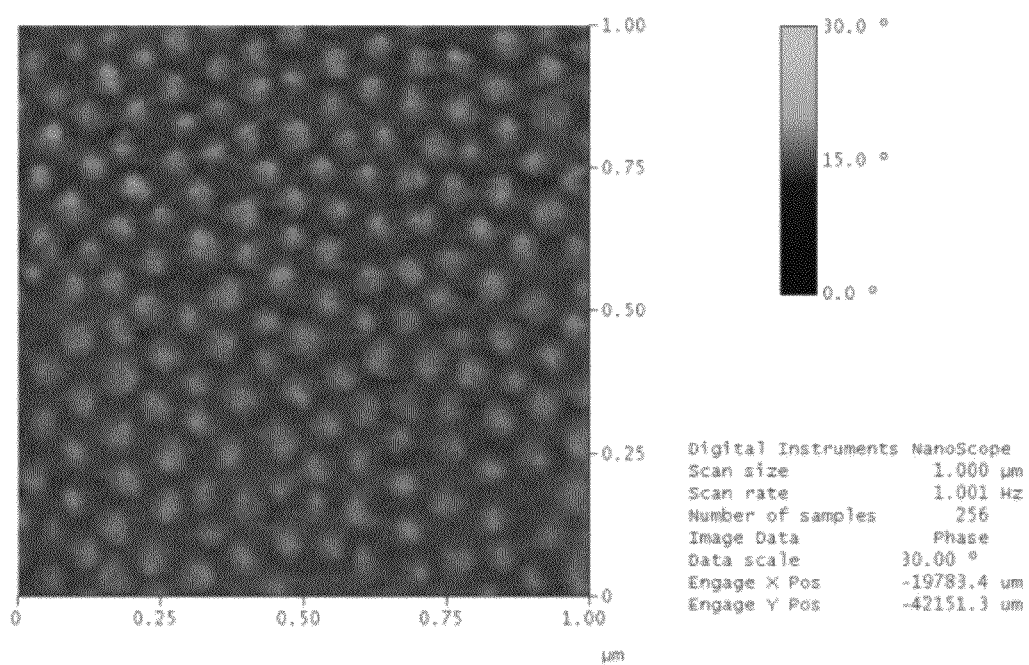
FIG. 2 is an atomic force microscopy (AFM) image of an exemplary patterned self-assembled block copolymer layer on an underlayer, patterned to have cylindrical self-assembled domains.

A sample of the wafer having the cylindrical domains thereon was then imaged by AFM. FIG. 2 shows an AFM image of the wafer in a 1 µm×1 µm scan area. The cylindrical domains can be seen in the figure. Each cylindrical domain is approximately 0.06 µm in diameter (60 nm) at a 1:1 pitch for a total spacing of 0.12 µm between domains. It can therefore be seen in FIGS. 2A and 2B that a underlayer, with an acid sensitive methacrylate copolymer composition matched to have approximately the same polarity ratio and to be neutral to one another, can provide phase-separated domains aligned to polar regions defined by diffusion of acid generated in exposed, overlying contact hole patterns in a photoresist into the underlayer.

All ranges disclosed herein are inclusive of the endpoints, and the endpoints are independently combinable with each other. The suffix "(s)" as used herein is intended to include both the singular and the plural of the term that it modifies, thereby including at least one of that term. As used herein, "combination" is inclusive of blends, mixtures, alloys, or reaction products.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A method of forming a pattern, comprising:
diffusing
an acid, generated in a photosensitive layer comprising a photoacid generator, by irradiating a portion of the photosensitive layer; into
an adjacent portion of a underlayer comprising an acid sensitive copolymer comprising an acid decomposable group, an attachment group, and a functional group, the attachment group being covalently bonded to a hydrophilic surface of a substrate, crosslinked to form an interpolymer crosslink, or both covalently bonded to the surface of the substrate and crosslinked to form an interpolymer crosslink, where the functional group is operative to adjust the neutrality of the acid-sensitive copolymer;
wherein the photosensitive layer is disposed on a surface of the underlayer, diffusing comprises heating the underlayer and photosensitive layer, and the acid sensitive group of the acid sensitive copolymer in the underlayer reacts with the diffused acid to form a polar region at the surface of the underlayer, the polar region having a shape of the pattern;
removing the photosensitive layer;
forming a self-assembling layer on the surface of the underlayer, the self-assembling layer comprising a block copolymer having a first block with an affinity for the polar region, and a second block having less affinity for the polar region than the first block,
wherein first block forms a first domain aligned to the polar region, and the second block forms a second domain aligned adjacent to the first domain, and
removing either the first or second domain to expose an underlying portion of the underlayer.

2. The method of claim 1, wherein the photosensitive layer is a positive tone photoresist.

3. The method of claim 1, wherein forming the underlayer comprises contacting a solution of the acid sensitive copolymer to the surface of the substrate by spin coating, dip coating, roll coating, spray coating, or doctor blading,
heating to remove solvent and form covalent bonds between the attachment group of the acid sensitive copolymer and the hydrophilic surface, and
washing the surface of the underlayer with solvent to remove any unbonded brush copolymer.

4. The method of claim 3, wherein forming the self-assembling layer comprises contacting a solution of the block copolymer to the surface of the underlayer by spin coating, dip coating, roll coating, spray coating, or doctor blading, and
annealing to remove solvent and form the first and second domains.

5. The method of claim 1, wherein selective irradiation is accomplished by exposure of the photosensitive layer with actinic radiation through a reticle, or by direct writing of a pattern onto the photosensitive layer by e-beam radiation.

6. The method of claim 1 wherein the irradiated portion of the underlayer form a sparse pattern having an interval greater than an interval spacing of the first and second domains.

7. The method of claim 6, further comprising additional first and second domains formed on the underlayer to fill the interval spacing of the sparse pattern, wherein the additional first domains are aligned to the second domain but not to a polar region, and the additional second domain is aligned to the additional first domain.

8. The method of claim 1 wherein the acid sensitive copolymer has the formula:

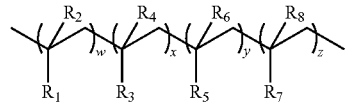

wherein $R_1$ is a $C_{1-30}$ acid decomposable group comprising a tertiary alkyl ester group, $R_3$ is a $C_{1-30}$ attachment group comprising a hydroxy group, $R_5$ and $R_7$ are independently a $C_{1-30}$ functional group comprising an aromatic group or ester group, $R_2$, $R_4$, $R_6$, and $R_8$ are independently H or a $C_{1-10}$ organic group, mole fractions w and x are 0.001 to 0.999, mole fractions y and z are 0 to 0.9, and the sum of mole fractions w, x, y, and z is 1.

* * * * *